(12) United States Patent
Ren et al.

(10) Patent No.: US 11,469,074 B2
(45) Date of Patent: Oct. 11, 2022

(54) MULTIPLE CHARGED-PARTICLE BEAM APPARATUS WITH LOW CROSSTALK

(71) Applicant: ASML Netherlands B.V., Veldhoven (NL)

(72) Inventors: Weiming Ren, San Jose, CA (US); Xuerang Hu, San Jose, CA (US); Qingpo Xi, Fremont, CA (US); Xuedong Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/886,461

(22) Filed: May 28, 2020

(65) Prior Publication Data
US 2020/0381207 A1    Dec. 3, 2020

Related U.S. Application Data

(60) Provisional application No. 62/853,677, filed on May 28, 2019.

(51) Int. Cl.
*H01J 37/244*   (2006.01)
*H01J 37/153*   (2006.01)
*H01J 37/28*    (2006.01)

(52) U.S. Cl.
CPC .......... *H01J 37/244* (2013.01); *H01J 37/153* (2013.01); *H01J 37/28* (2013.01); *H01J 2237/0453* (2013.01); *H01J 2237/2448* (2013.01); *H01J 2237/24475* (2013.01)

(58) Field of Classification Search
CPC .. H01J 37/00; H01J 37/02; H01J 37/04; H01J 37/24; H01J 37/26; H01J 37/26128; H01J 37/153

(Continued)

(56) References Cited

U.S. PATENT DOCUMENTS 3,628,014 A   12/1971  Grubic, Jr.
7,425,703 B2   9/2008  Nakasuji et al.
(Continued)

FOREIGN PATENT DOCUMENTS

CN   108738343 A   11/2018
JP      63-17523    1/1988
(Continued)

OTHER PUBLICATIONS

International Search Report issued by the International Searching Authority in related International Application No. PCT/EP2020/063831, dated Jul. 29, 2020 (3 pgs.).

(Continued)

*Primary Examiner* — Jason L McCormack
(74) *Attorney, Agent, or Firm* — Finnegan, Henderson, Farabow, Garrett & Danner, LLP

(57) ABSTRACT

Systems and methods of enhancing imaging resolution by reducing crosstalk between detection elements of a secondary charged-particle detector in a multi-beam apparatus are disclosed. The multi-beam apparatus may comprise an electro-optical system for projecting a plurality of secondary charged-particle beams from a sample onto a charged-particle detector. The electro-optical system may include a first pre-limit aperture plate comprising a first aperture configured to block peripheral charged-particles of the plurality of secondary charged-particle beams, and a beam-limit aperture array comprising a second aperture configured to trim the plurality of secondary charged-particle beams. The charged-particle detector may include a plurality of detection elements, wherein a detection element of the plurality of detection elements is associated with a corresponding trimmed beam of the plurality of secondary charged-particle beams.

18 Claims, 12 Drawing Sheets

800

(58) Field of Classification Search
USPC .............................. 250/306, 307, 310, 311
See application file for complete search history.

(56) References Cited

U.S. PATENT DOCUMENTS

| | | | |
|---|---|---|---|
| 2005/0214958 A1* | 9/2005 | Nakasuji | H01J 37/28 438/14 |
| 2011/0163229 A1 | 7/2011 | Frosien et al. | |
| 2013/0270438 A1 | 10/2013 | Lanio et al. | |
| 2015/0287570 A1* | 10/2015 | Hayashi | H01J 37/185 250/310 |
| 2017/0003235 A1* | 1/2017 | Firnkes | H01J 37/26 |
| 2017/0154756 A1* | 6/2017 | Ren | H01J 37/14 |

FOREIGN PATENT DOCUMENTS

| | | |
|---|---|---|
| TW | I613693 B | 2/2018 |
| WO | WO 2017/095908 A1 | 6/2017 |

OTHER PUBLICATIONS

Office Action issued by the Intellectual Property Office of Taiwan in related Taiwanese Patent Application No. 109116995; dated May 20, 2021 (12 pgs.).

Y. Kumashiro et al., Electron-Emission Characteristics and Surface States of Carbides Emitters—TiCSingle Crystal and Other Transition Metal Carbides-, Journal Applied Physics, vol. 45, No. 7, 1976, pp. 607-614 (9 pgs.).

\* cited by examiner

MULTIPLE CHARGED-PARTICLE BEAM APPARATUS WITH LOW CROSSTALK

CROSS-REFERENCE TO RELATED APPLICATIONS

This application claims priority of U.S. application 62/853,677 which was filed on May 28, 2019, and which is incorporated by reference in its entirety.

TECHNICAL FIELD

The embodiments provided herein disclose a multi-beam apparatus, and more particularly a multi-beam charged particle microscope with enhanced imaging signal fidelity using a combination of aperture arrays configured to reduce crosstalk.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important. Although multiple electron beams may be used to increase the throughput, the limitation in fidelity of imaging signals received by charged-particle detectors may limit the imaging resolution desired for reliable defect detection and analysis rendering the inspection tools inadequate for their desired purpose.

SUMMARY

In some embodiments of the present disclosure, an electro-optical system of a multi charged-particle beam apparatus is disclosed. The electro-optical system may comprise a first pre-limit aperture plate comprising a first aperture configured to block peripheral charged-particles of a plurality of secondary charged-particle beams from a sample, and a beam-limit aperture array comprising a second aperture configured to trim the plurality of secondary charged-particle beams. The electro-optical system may further comprise a charged-particle detector including a plurality of detection elements, wherein a detection element of the plurality of detection elements is associated with a corresponding trimmed beam of the plurality of secondary charged-particle beams.

The distance between the first pre-limit aperture plate and the beam-limit aperture array may be 5 mm or less. The first pre-limit aperture plate may be positioned upstream or downstream from the beam-limit aperture array. The electro-optical system may comprise a second pre-limit aperture plate. The first pre-limit aperture plate may be positioned upstream from the beam-limit aperture array and the second pre-limit aperture plate may be positioned downstream from the beam-limit aperture array. The beam-limit aperture array may comprise a plurality of apertures of different sizes. At least two of the plurality of apertures may have similar sizes. The plurality of apertures may be arranged in a rectangular, a circular, or a spiral pattern.

The plurality of secondary charged-particle beams may comprise at least one of secondary electrons or backscattered electrons generated from the sample in response to an interaction between a plurality of primary charged-particle beams and the sample. The plurality of secondary charged-particle beams may overlap to create a crossover area on a crossover plane perpendicular to a secondary optical axis of the electro-optical system. The beam-limit aperture array may be placed on or within a range of positions of the crossover plane and perpendicular to the secondary optical axis. The range of positions of the crossover plane may be determined based on a landing energy of the plurality of primary charged-particle beams on the sample. The beam-limit aperture array may be movable along the secondary optical axis based on the range of positions of the crossover plane.

The second aperture may be centered with the crossover area. The centers of the first and the second apertures may be aligned with the secondary optical axis. The beam-limit aperture array may be movable to align an aperture of the plurality of apertures with the crossover area. A plane of the first pre-limit aperture plate may be outside the range of positions of the crossover plane and planes of the beam-limit aperture array and the first pre-limit aperture plate may be within the range of positions of the crossover plane.

In another embodiment of the present disclosure, a multi charged-particle beam apparatus is disclosed. The multi charged-particle beam apparatus may include an electro-optical system for projecting a plurality of secondary charged-particle beams from a sample onto a charged-particle detector. The electro-optical system may comprise a first pre-limit aperture plate comprising a first aperture configured to block peripheral charged-particles of the plurality of secondary charged-particle beams, and a beam-limit aperture array comprising a second aperture configured to trim the plurality of secondary charged-particle beams. The charged-particle detector may include a plurality of detection elements, and a detection element of the plurality of detection elements may be associated with a corresponding trimmed beam of the plurality of secondary charged-particle beams.

In some embodiments of the present disclosure, a method performed by a secondary imaging system to form images of a sample may be disclosed. The method may include generating a plurality of secondary charged-particle beams from the sample, blocking peripheral charged-particles of the plurality of secondary charged-particle beams using a pre-limit aperture plate, trimming the plurality of secondary charged-particle beams using an aperture of a beam-limit aperture array; and projecting the plurality of trimmed secondary charged-particle beams onto a corresponding detection element of a charged-particle detector.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
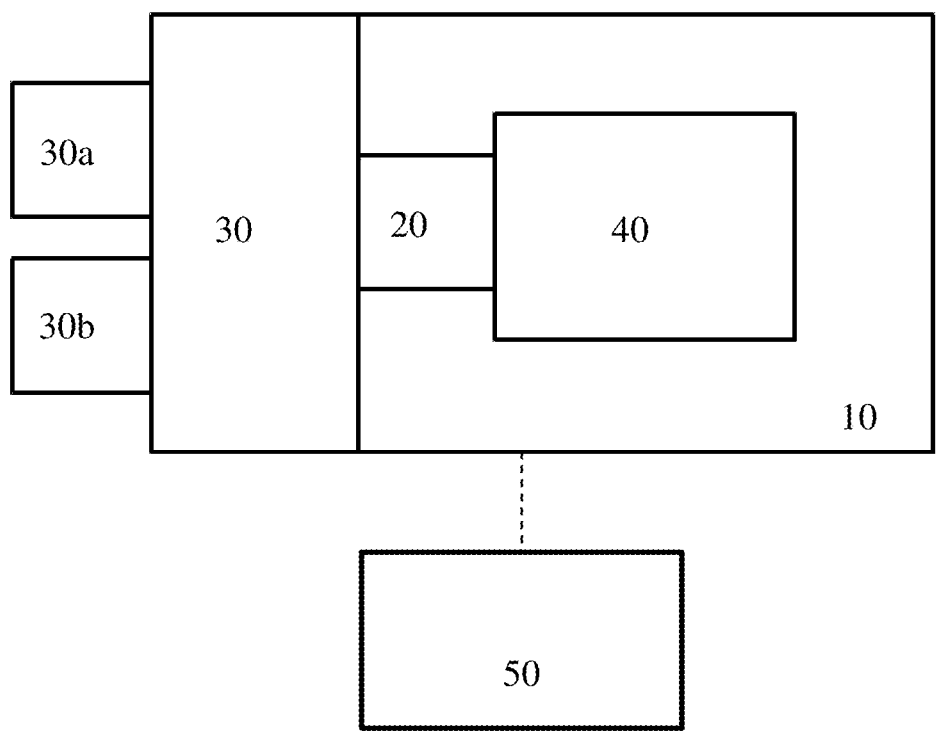
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Although a multiple charged-beam particle imaging system, such as a multi-beam SEM, may be useful in increasing the wafer inspection throughput, the imaging resolution of multi-beam SEM may be limited by the quality of the imaging signals received and detected by the secondary electron detection system. A secondary charged-particle beam such as an electron beam, generated by the interaction of primary beamlets on sample surface, may comprise secondary electrons with a large energy spread of ~50 eV and a large emission angle range of ~90° with respect to a normal of the sample surface. Such defocused electron beams may have a large incidence spot on a secondary electron detector. In conventional multi-beam SEMs, the defocused electron beam may be incident upon multiple detection elements of the secondary electron detector. In other words, each of the multiple detection elements may receive secondary electrons from a corresponding secondary electron beam and other adjacent beams. Consequently, the imaging signal of one detection element may comprise a main component originating from the corresponding secondary electron beam and a crosstalk component originating from adjacent electron beams. The crosstalk component, among other things, may deteriorate the fidelity of the imaging signal. Therefore, it is desirable to minimize crosstalk between multiple detection elements to enhance the imaging resolution.

To mitigate the occurrence of crosstalk, an aperture mechanism may be employed in a secondary imaging system to block off peripheral secondary electrons. However, if the secondary electron beam radius is larger than the distance between two apertures of the aperture mechanism, some of the electrons of the secondary electron beam may escape through the adjacent aperture, resulting in crosstalk between detection elements of the secondary electron detector.

To accommodate the large radii of the secondary electron beams, the apertures may be placed farther apart, and the aperture mechanism may be moved in the x and y axes relative to the optical axis (z axis) of the secondary imaging system. However, the movement of aperture mechanism in the x and y axes may be limited due to space restrictions within the secondary imaging system, and therefore may limit the number of apertures within the aperture array. One of the several problems that may be encountered is that the aperture mechanism may not be capable of mitigating crosstalk while allowing maximum number of secondary electrons to pass through for enhanced imaging resolution.

In some embodiments of the present disclosure, a multi-beam apparatus may include an electro-optical system for projecting a plurality of secondary electrons from a sample onto a charged-particle detector. The electro-optical system may comprise a pre-limit aperture plate configured to block peripheral secondary electrons and a beam-limit aperture array comprising an aperture configured to trim the plurality of secondary electrons. The pre-limit aperture plate may be positioned upstream from the beam-limit aperture array and may prevent peripheral secondary electrons from irradiating unintended apertures of beam-limit aperture array, and the beam-limit aperture array may further prevent peripheral secondary electrons from irradiating detection elements of an electron detector. The combination of a pre-limit aperture plate and a beam-limit aperture array may mitigate the crosstalk between detection elements, thus enhancing imaging resolution.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
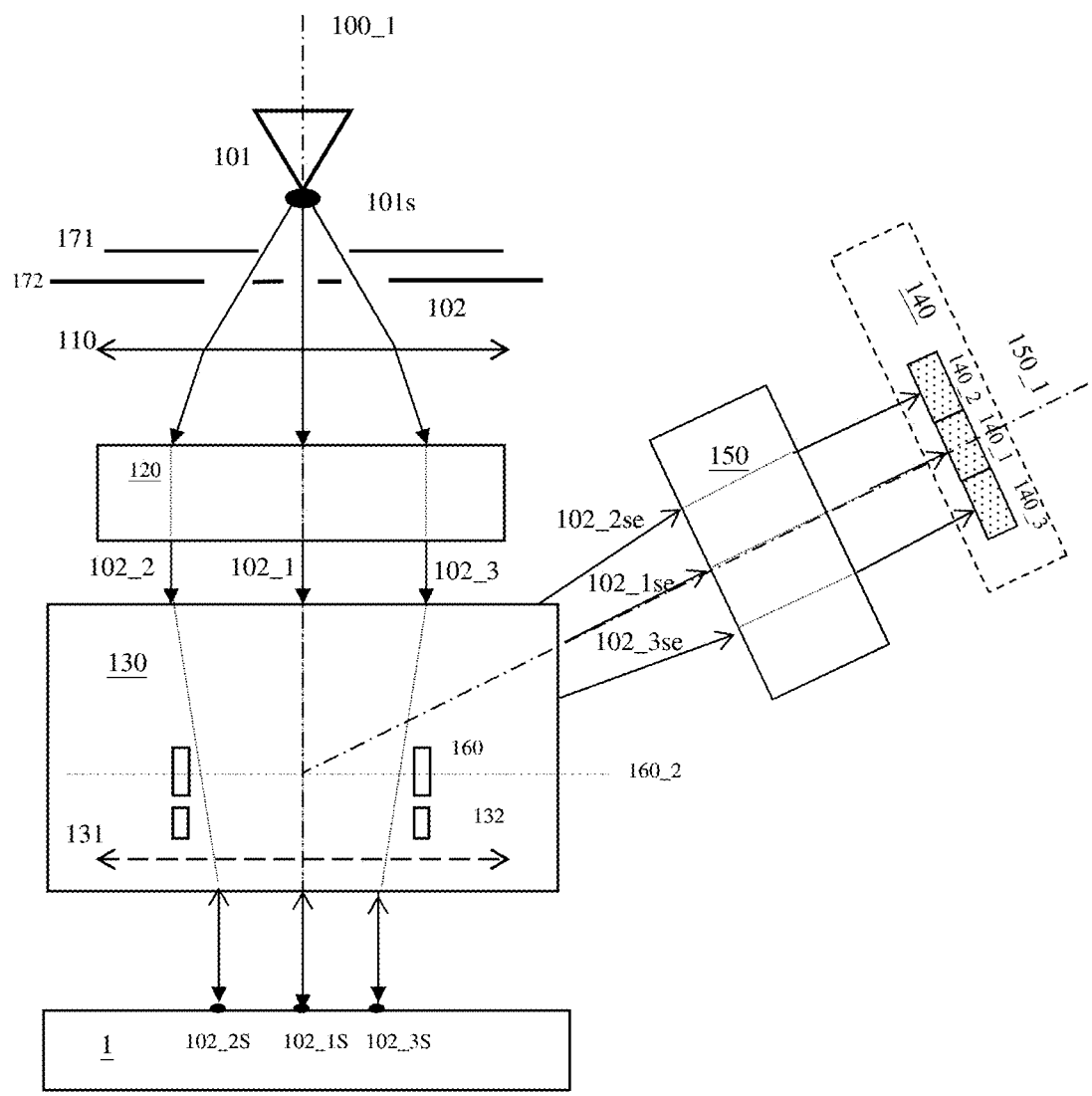
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool 40 that can be a part of the exemplary charged particle beam inspection system 100 of FIG. 1, consistent with embodiments of the present disclosure. An electron beam tool 40 (also referred to herein as apparatus 40) comprises an electron source 101, a gun aperture plate 171 with a gun aperture 103, a pre-beamlet forming mechanism 172, a condenser lens 110, a source conversion unit 120, a primary projection optical system 130, a sample stage (not shown in FIG. 2), a secondary imaging system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 40 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary imaging system 150 and electron detection device 140 can be aligned with a secondary optical axis 150_1 of apparatus 40.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 may comprise an image-forming element array (not shown in FIG. 2), an aberration compensator array (not shown), a beam-limit aperture array (not shown), and a pre-bending micro-deflector array (not shown). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 as an example, and it is appreciated that the source conversion unit 120 can handle any number of beamlets.

In some embodiments, source conversion unit 120 may be provided with beam-limit aperture array and image-forming element array (both are not shown). The beam-limit aperture array may comprise beam-limit apertures. It is appreciated that any number of apertures may be used, as appropriate. Beam-limit apertures may be configured to limit sizes of beamlets 102_1, 102_2, and 102_3 of primary-electron beam 102. The image-forming element array may comprise image-forming deflectors (not shown) configured to deflect beamlets 102_1, 102_2, and 102_3 by varying angles towards primary optical axis 100_1. In some embodiments, deflectors further away from primary optical axis 100_1 may deflect beamlets to a greater extent. Furthermore, image-forming element array may comprise multiple layers (not illustrated), and deflectors may be provided in separate layers. Deflectors may be configured to be individually controlled independent from one another. In some embodiments, a deflector may be controlled to adjust a pitch of probe spots (e.g., 102_1S, 102_2S, and 102_3S) formed on a surface of sample 1. As referred to herein, pitch of the probe spots may be defined as the distance between two immediately adjacent probe spots on the surface of sample 1.

A centrally located deflector of image-forming element array may be aligned with primary optical axis 100_1 of electron beam tool 40. Thus, in some embodiments, a central deflector may be configured to maintain the trajectory of beamlet 102_1 to be straight. In some embodiments, the central deflector may be omitted. However, in some embodiments, primary electron source 101 may not necessarily be aligned with the center of source conversion unit 120. Furthermore, it is appreciated that while FIG. 2 shows a side view of apparatus 40 where beamlet 102_1 is on primary optical axis 100_1, beamlet 102_1 may be off primary optical axis 100_1 when viewed from a different side. That is, in some embodiments, all of beamlets 102_1, 102_2, and 102_3 may be off-axis. An off-axis component may be offset relative to primary optical axis 100_1.

The deflection angles of the deflected beamlets may be set based on one or more criteria. In some embodiments, deflectors may deflect off-axis beamlets radially outward or away (not illustrated) from primary optical axis 100_1. In some embodiments, deflectors may be configured to deflect off-axis beamlets radially inward or towards primary optical axis 100_1. Deflection angles of the beamlets may be set so that beamlets 102_1, 102_2, and 102_3 land perpendicularly on sample 1. Off-axis aberrations of images due to lenses, such as objective lens 131, may be reduced by adjusting paths of the beamlets passing through the lenses. Therefore, deflection angles of off-axis beamlets 102_2 and 102_3 may be set so that probe spots 102_2S and 102_3S have small aberrations. Beamlets may be deflected so as to pass through or close to the front focal point of objective lens 131 to decrease aberrations of off-axis probe spots 102_2S and 102_3S. In some embodiments, deflectors may be set to make beamlets 102_1, 102_2, and 102_3 land perpendicularly on sample 1 while probe spots 102_1S, 102_2S, and 102_3S have small aberrations.

Condenser lens 110 is configured to focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. The electric currents may be changed by both, altering the radial sizes of beam-limit apertures and the focusing power of condenser lens 110. Condenser lens 110 may be an adjustable condenser lens that may be configured so that the position of its first principle plane is movable. The adjustable condenser lens may be configured to be magnetic, which may result in off-axis beamlets 102_2 and 102_3 illuminating source conversion unit 120 with rotation angles. The rotation angles may change with the focusing power or the position of the first principal plane of the adjustable condenser lens. Accordingly, condenser lens 110 may be an anti-rotation condenser lens that may be configured to keep the rotation angles unchanged while the focusing power of condenser lens 110 is changed. In some embodiments, condenser lens 110 may be an adjustable anti-rotation condenser lens, in which the rotation angles do not change when the focusing power and the position of the first principal plane of condenser lens 110 are varied.

Electron beam tool 40 may comprise pre-beamlet forming mechanism 172. In some embodiments, electron source 101 may be configured to emit primary electrons and form a primary electron beam 102. In some embodiments, gun aperture plate 171 may be configured to block off peripheral electrons of primary electron beam 102 to reduce the Coulomb effect. In some embodiments, pre-beamlet-forming mechanism 172 further cuts the peripheral electrons of primary electron beam 102 to further reduce the Coulomb effect. Primary-electron beam 102 may be trimmed into three primary electron beamlets 102_1, 102_2, and 102_3 (or any other number of beamlets) after passing through pre-beamlet forming mechanism 172. Electron source 101, gun aperture plate 171, pre-beamlet forming mechanism 172, and condenser lens 110 may be aligned with a primary optical axis 100_1 of electron beam tool 40.

Pre-beamlet forming mechanism 172 may comprise a Coulomb aperture array. A center aperture, also referred to herein as the on-axis aperture, of pre-beamlet-forming mechanism 172 and a central deflector of source conversion unit 120 may be aligned with primary optical axis 100_1 of electron beam tool 40. Pre-beamlet-forming mechanism 172 may be provided with a plurality of pre-trimming apertures (e.g., a Coulomb aperture array). In FIG. 2, the three beamlets 102_1, 102_2 and 102_3 are generated when primary electron beam 102 passes through the three pre-trimming apertures, and much of the remaining part of primary electron beam 102 is cut off. That is, pre-beamlet-forming mechanism 172 may trim much or most of the electrons from primary electron beam 102 that do not form the three beamlets 102_1, 102_2 and 102_3. Pre-beamlet-forming mechanism 172 may cut off electrons that will ultimately not be used to form probe spots 102_1S, 102_2S and 102_3S before primary electron beam 102 enters source conversion unit 120. In some embodiments, a gun aperture plate 171 may be provided close to electron source 101 to cut off electrons at an early stage, while pre-beamlet forming mechanism 172 may also be provided to further cut off electrons around a plurality of beamlets. Although FIG. 2 demonstrates three apertures of pre-beamlet forming mechanism 172, it is appreciated that there may be any number of apertures, as appropriate.

In some embodiments, pre-beamlet forming mechanism 172 may be placed below condenser lens 110. Placing pre-beamlet forming mechanism 172 closer to electron source 101 may more effectively reduce the Coulomb effect. In some embodiments, gun aperture plate 171 may be omitted when pre-beamlet forming mechanism 172 is able to be located sufficiently close to source 101 while still being manufacturable.

Objective lens 131 may be configured to focus beamlets 102_1, 102_2, and 102_3 onto a sample 1 for inspection and can form three probe spots 102_1s, 102_2s, and 102_3s on surface of sample 1. Gun aperture plate 171 can block off peripheral electrons of primary electron beam 102 not in use to reduce Coulomb interaction effects. Coulomb interaction effects can enlarge the size of each of probe spots 102_1s, 102_2s, and 102_3s, and therefore deteriorate inspection resolution.

Beam separator 160 may be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 1. In response to incidence of beamlets 102_1, 102_2, and 102_3 at probe spots 102_1s, 102_2s, and 102_3s, three secondary electron beams 102_1se, 102_2se, and 102_3se may be emitted from sample 1. Each of secondary electron beams 102_1se, 102_2se, and 102_3se can comprise electrons with a distribution of energies including secondary electrons (energies <50 eV) and backscattered electrons (energies between 50 eV and landing energies of beamlets 102_1, 102_2, and 102_3). Beam separator 160 can direct secondary electron beams 102_1se, 102_2se, and 102_3se towards secondary imaging system 150. Secondary imaging system 150 can focus secondary electron beams 102_1se, 102_2se, and 102_3se onto detection elements 140_1, 140_2, and 140_3 of electron detection device 140. Detection elements 140_1, 140_2, and 140_3 can detect corresponding secondary electron beams 102_1se, 102_2se, and 102_3se and generate corresponding signals used to construct images of the corresponding scanned areas of sample 1.

In FIG. 2, three secondary electron beams 102_1se, 102_2se, and 102_3se respectively generated by three probe spots 102_1S, 102_2S, and 102_3S, travel upward towards electron source 101 along primary optical axis 100_1, pass through objective lens 131 and deflection scanning unit 132 in succession. The three secondary electron beams 102_1se, 102_2se and 102_3se are diverted by beam separator 160 (such as a Wien Filter) to enter secondary imaging system 150 along secondary optical axis 150_1 thereof. Secondary imaging system 150 focuses the three secondary electron beams 102_1se~102_3se onto electron detection device 140 which comprises three detection elements 140_1, 140_2, and 140_3. Therefore, electron detection device 140 can simultaneously generate the images of the three scanned regions scanned by the three probe spots 102_1S, 102_2S and 102_3S, respectively. In some embodiments, electron detection device 140 and secondary imaging system 150 form one detection unit (not shown). In some embodiments, the electron optics elements on the paths of secondary electron beams such as, but not limited to, objective lens 131, deflection scanning unit 132, beam separator 160, secondary imaging system 150 and electron detection device 140, may form one detection system.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 1. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 140. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 1. The acquired images may comprise multiple images of a single imaging area of sample 1 sampled multiple times over a time sequence. The multiple images may be stored in the storage. In some embodiments, controller 50 may be configured to perform image processing steps with the multiple images of the same location of sample 1.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 102_1, 102_2, and 102_3 incident on the wafer surface, can be used to reconstruct images of the wafer structures under inspection. The reconstructed images can be used to reveal various features of the internal or external structures of sample 1, and thereby can be used to reveal any defects that may exist in the wafer.

In some embodiments, controller 50 may control a motorized stage (not shown) to move sample 1 during inspection. In some embodiments, controller 50 may enable the motorized stage to move sample 1 in a direction continuously at a constant speed. In other embodiments, controller 50 may enable the motorized stage to change the speed of the movement of sample 1 over time depending on the steps of scanning process. In some embodiments, controller 50 may adjust a configuration of primary projection optical system 130 or secondary imaging system 150 based on images of secondary electron beams 102_1se, 102_2se, and 102_3se.

Although FIG. 2 shows that electron beam tool 40 uses three primary electron beams, it is appreciated that electron beam tool 40 may use two or more number of primary electron beams. The present disclosure does not limit the number of primary electron beams used in apparatus 40.

Figure 3:
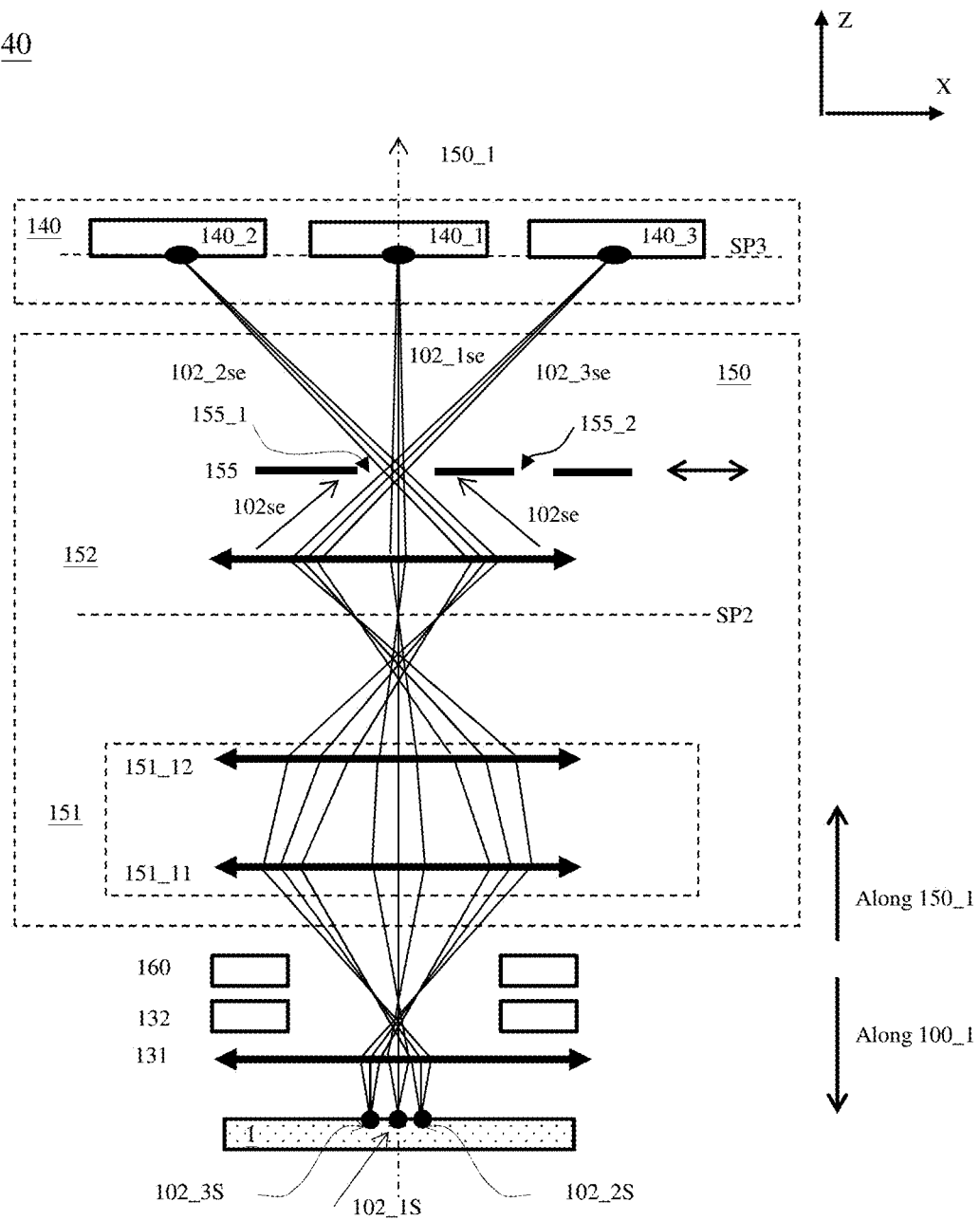
FIG. 3 is a schematic diagram illustrating an exemplary configuration of a secondary imaging system in a multi-beam apparatus, consistent with embodiments of the present disclosure.

Reference is now made to FIG. 3, which is a schematic diagram of an exemplary configuration of a secondary imaging system in a multi-beam apparatus, consistent with embodiments of the present disclosure. It is appreciated that secondary imaging system 150 may be part of charged-particle beam inspection system (e.g., electron beam inspection system 100 of FIG. 1).

In some embodiments, secondary imaging system 150 will be shown and described together with the entire detection system, as illustrated in FIG. 3. With reference to FIG. 3, only three secondary electron beams with respect to three probe spots are shown, although there may be any number of secondary electron beams. Within the entire detection system, starting from sample 1, the first part is along primary optical axis 100_1 and the second part is along secondary optical axis 150_1. For illustrative purposes only and bearing no resemblance to the actual configuration, the first part is rotated to be along secondary optical axis 150_1 such that the entire detection system can be shown along one straight optical axis.

In some embodiments, as illustrated in FIG. 3, secondary imaging system 150 may include zoom lens 151, projection lens 152, secondary beam-limit aperture array 155, and anti-scanning deflection unit (not shown), all aligned with secondary optical axis 150_1. Detection elements 140_1, 140_2, and 140_3 of electron detection device 140 may be placed on a detection plane SP3, normal to secondary optical axis 150_1. Zoom lens 151, projection lens 152, and objective lens 131 together project the surface of sample 1 onto a detection plane SP3, i.e. focus the secondary electron beams 102_1se-102_3se to form secondary-electron spots on detection elements 140_1, 140_2 and 140_3, respectively, when deflection scanning unit 132 is off.

In some embodiments, zoom lens 151 may comprise two electrostatic lenses 151_11 and 151_12. The image plane of zoom lens 151 may be at a transfer plane SP2, as illustrated in FIG. 3. Projection lens 152 may comprise one electrostatic lens and one magnetic lens (both are not shown), and the image plane thereof may be at detection plane SP3. The first imaging magnification M1 from the surface of sample 1 to transfer plane SP2 may be realized by objective lens 131 and zoom lens 151, whereas the second imaging magnification M2 from transfer plane SP2 to detection plane SP3 may be realized by projection lens 152, and the total imaging magnification M from the surface of sample 1 to detection plane SP3 may be determined based on M1 and M2. Specifically, the total imaging magnification M may be based on M1*M2.

In some embodiments, zoom lens 151 may be configured to perform the zoom function. By adjusting the focusing power of the two electrostatic lenses 151_11 and 151_12, the first imaging magnification M1 can be varied to achieve the desired value of the total imaging magnification M. Projection lens 152 may be configured to perform the anti-rotating function. By adjusting the magnetic field of the magnetic lens and the focusing power of the electrostatic lens, the total image rotation on detection plane SP3 and the second imaging magnification M2 can remain the same. The anti-scanning deflection unit (not shown) may be configured to perform the anti-scanning function. By synchronously deflecting the secondary electron beams with deflection scanning unit 132, the displacements of three secondary electron spots on the detection plane SP3 can be substantially canceled. Consequently, the corresponding relationship between the plurality of probe spots and the plurality of detection elements can always be kept. To reduce the additional aberrations of zoom lens 151 and projection lens 152, which come from the deflection of the secondary electron beams generated by deflection scanning unit 132, the anti-scanning deflection unit is better placed before zoom lens 151 and hence the secondary electron beams will pass through zoom lens 151 and projection lens 152 in a way as if deflection scanning unit 132 is off. However, in this case, zoom lens 151 may be placed far away from beam separator 160 and, consequently may generate large initial aberrations.

As is commonly known in the art, the emission of secondary electrons obeys Lambert's law and has a large energy spread. While the energy of a secondary electron may be up to 50 eV, most have an energy of approximately 5 eV, depending on the sample material, among other things. The landing energy of the primary electron beamlets, such as the energy of beamlet 102_1 as it lands on the sample, may be in the range of 0.1 keV to 5 keV. The landing energy may be adjusted by varying either or both of the bias of primary electron source 101 or the bias of sample 1. Therefore, the excitation of objective lens 131 may be adjusted to provide the corresponding focusing power for the three beamlets.

Further, for reduced aberrations, objective lens 131 may be a magnetic or an electromagnetic compound lens configured to rotate the beamlets and affect the landing energy. Because the size, the position, or the magnification of the secondary electron spots formed by the secondary electron beams 102_1se, 102_2se, and 102_3se on detection elements 140_1, 140_2, and 140_3 may vary, the secondary electron spots may partially enter a detection element adjacent to the corresponding detection element. The secondary electrons detected by the adjacent detection elements may generate image overlaps, for example, causing deterioration of image resolution. The image signal from one detection element may include information from more than one scanned region of sample 1, resulting in loss of resolution due to crosstalk.

Crosstalk in multi-beam SEMs such as EBI system 100 may be mitigated by using a secondary beam-limit aperture array 155 to cut off the peripheral secondary electrons of the secondary electron beam such as 102_1se, for example Secondary beam-limit aperture array 155 may comprise a plurality of apertures. Although FIG. 3 illustrates only two apertures, 155_1 and 155_2, any number of apertures may be used, as appropriate. For example, secondary beam-limit aperture array 155 illustrated in FIG. 4 (described later) comprises six apertures, 155_1, 155_2, 155_3, 155_4, 155_5, and 155_6.

In general, when the size of an aperture (e.g., aperture 155_1 of FIG. 3) of secondary beam-limit aperture 155 increases, the overall collection efficiency of a secondary electron detector may increase. However, the difference in collection efficiencies of each detection element of the detector may also increase, and the crosstalk among detection elements 140_1, 140_2, and 140_3 may increase as well. Although the increase in overall collection efficiency of electron detection device 140 increases the throughput, however, the difference in collection efficiencies of each detection element 140_1, 140_2, and 140_3 may cause the grey levels of images formed by secondary electron beams 102_1se-102_3se to differ more. One or more additional processes may be performed to eliminate the inspection errors due to the difference of grey levels, thereby decreasing inspection throughput and deteriorating resolution of the MBI apparatus. When the crosstalk among secondary electron beams 102_1se-102_3se increases, the images formed by secondary electron beams 102_1se-102_3se may be degraded. That is, large crosstalk deteriorates inspection resolution of the MBI apparatus.

In some embodiments, each of the apertures of secondary beam-limit aperture array 155 may have uniform or non-uniform size, shape, or cross-section. The smaller the radial size of an aperture, the lower the collection efficiencies and the crosstalk of the imaging signals of detection elements 140_1, 140_2, and 140_3 will generally be. Therefore, the radial size of the apertures may depend on the application or the desired outcome.

In some embodiments in which objective lens 131 functions in a non-magnetic immersion mode, the angular velocity of the emerging secondary electrons may be zero on the sample surface. In such embodiments, the chief rays of off-axis secondary electron beams 102_2se and 102_3se may still be meridional after exiting objective lens 131 and may be able to cross secondary optical axis 150_1 of secondary imaging system 150. Furthermore, the chief rays can cross secondary optical axis 150_1 at a same place (if aberrations are not considered) in secondary imaging system 150. As such, secondary electron beams 102_1se-102_3se may be configured to overlap at a common area of crossing and therefore form a relatively sharp secondary beam crossover. The plane where the common area of crossing or secondary beam crossover is located is referred to as a crossing plane or secondary beam crossover plane.

While FIG. 3 illustrates an exemplary relatively sharp secondary beam crossover plane formed by fully overlapping secondary beams 102_1se-102_3se on one crossing plane, it is appreciated that one or more of the secondary electron beams may be offset from others on the crossing plane and the secondary beam crossover may not be that sharp, forming a range of secondary beam crossover planes along secondary optical axis 150_1. The position of secondary beam crossover plane may depend on landing energies of primary beamlets or excitations of objective lens 131, among other things. In some embodiments, secondary beam-limit aperture array 155 may be positioned on the secondary beam crossover plane, or in other words, the plane of secondary beam-limit aperture array 155 may coincide with the secondary beam crossover plane. In some embodiments, the plane of secondary beam limit aperture array 155 may be within a moving range of positions of secondary beam crossover plane. Secondary beam-limit aperture array 155 may be moved along secondary beam crossover plane such that the desired aperture or aperture size may be used to block off peripheral secondary electrons directed towards electron detection device 140. In some embodiments, secondary beam-limit aperture array 155 may be placed at an optimal position within the range of positions of the secondary beam crossover plane.

Figure 4:
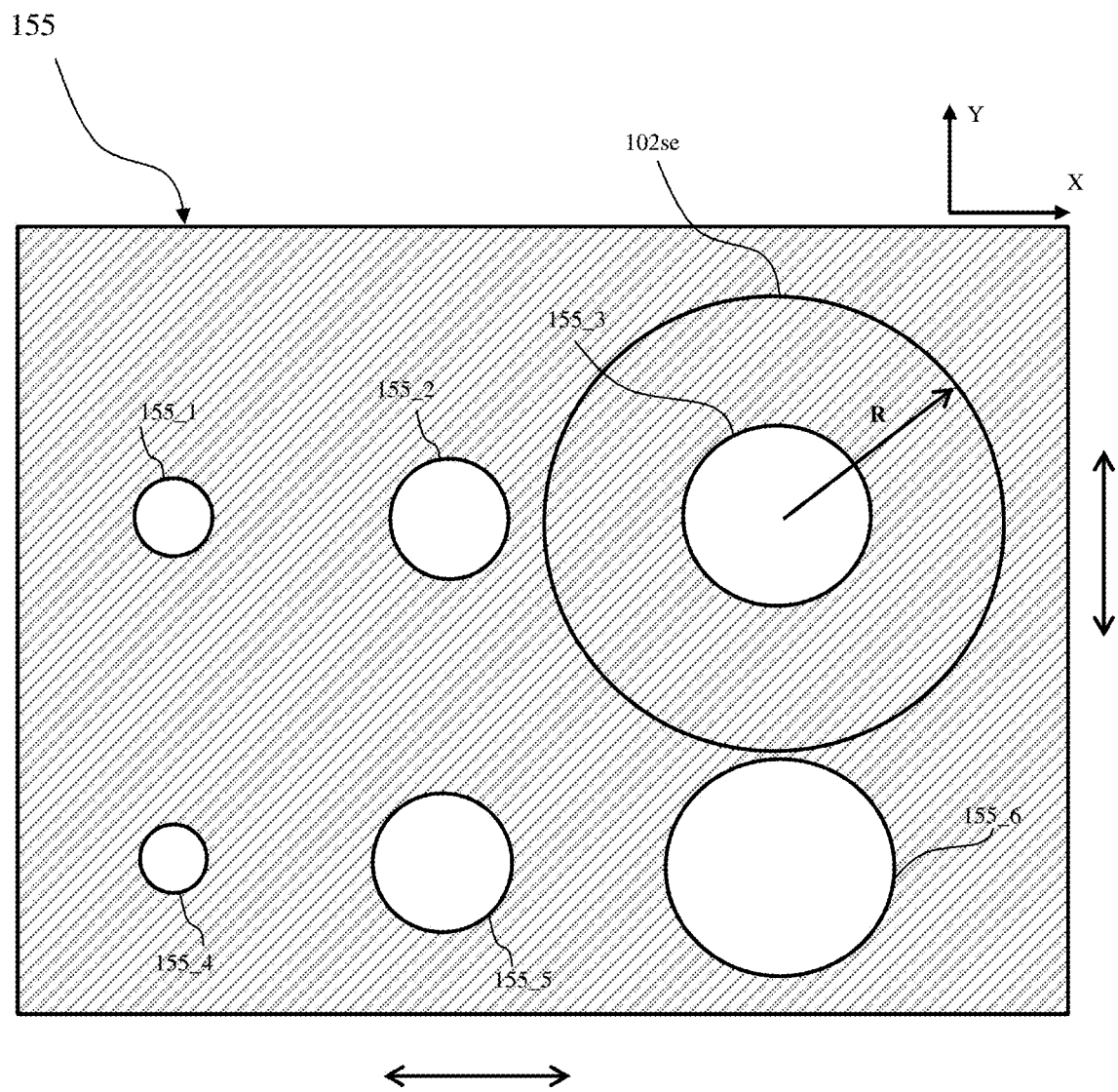
FIG. 4 is a schematic diagram illustrating an exemplary arrangement of apertures on an aperture array of secondary imaging system of FIG. 3, consistent with embodiments of the present disclosure.

Reference is now made to FIG. 4, which illustrates a schematic diagram of exemplary arrangement of apertures on secondary beam-limit aperture array 155, consistent with embodiments of the present disclosure. Although beam-limit aperture array 155 comprises six apertures of varying sizes are illustrated in FIG. 4, any number of apertures may be used.

As shown in FIG. 4, a cross-section 102se represents a cross-section of the overlapping secondary electron beams 102_1se-102_3se incident on secondary beam-limit aperture array 155. In some embodiments, secondary electron beams 102_1se-102_3se may not overlap at the same crossing plane to form a sharp secondary beam crossover, but instead may be offset along secondary optical axis 150_1 such that they form a range of crossing planes. In such cases, cross-section 102se of overlapping secondary electron beams 102_1se-102_3se may not be sharp.

In some embodiments, to minimize the occurrence of crosstalk, the distance between two adjacent apertures such as 155_2 and 155_3 may be larger than the sum of radius R of overlapped secondary electron beam 102se and a radius of the larger one of the two apertures. In some embodiments, secondary beam-limit aperture array 155 may comprise at least two apertures of equal size, and in such cases, the distance between two adjacent apertures such as 155_2 and 155_3 may be larger than the sum of radius R of cross-section 102se of overlapping secondary electron beams 102_1se-102_3se and a radius of the either one of the two apertures.

In some embodiments, radius R of cross-section 102se of overlapping secondary electron beams 102_1se-102_3se may depend on landing energies of primary beamlets or excitations of objective lens 131. Therefore, to accommodate a wide range of radii of overlapping secondary electron beams 102_1se-102_3se (represented by cross-section 102se of FIG. 4), the distance between two adjacent apertures may be determined based on the largest value of radius R.

Figure 5:
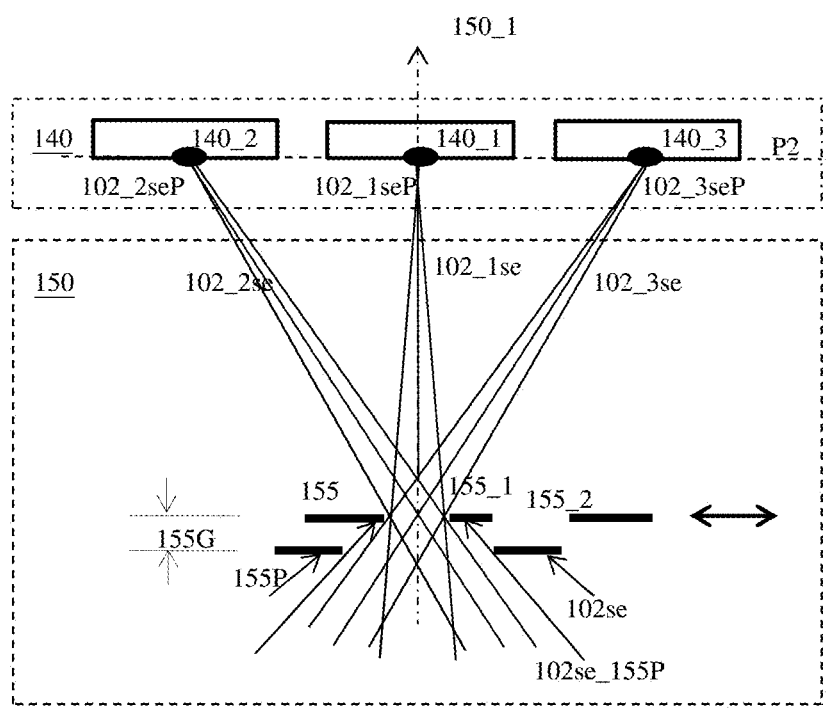
FIG. 5 is a schematic diagram illustrating an exemplary configuration of a secondary imaging system in a multi-beam apparatus, consistent with embodiments of the present disclosure.

Reference is now made to FIG. 5, which illustrates an exemplary configuration of a secondary imaging system 150 in an electron beam tool 500 of a multi-beam apparatus, consistent with embodiments of the present disclosure. In comparison to secondary imaging system 150 of electron beam tool 40 of FIG. 3, secondary imaging system 150 of electron beam tool 500 may include a pre-limit aperture plate 155P.

As illustrated in FIG. 5, pre-limit aperture plate 155P may comprise a plate with an aperture configured to block peripheral electrons while allowing axial electrons of secondary electron beams 102_1se-102_3se. In some embodiments, pre-limit aperture plate 155P may be aligned with secondary beam-limit aperture array 155 and secondary optical axis 150_1 such that it blocks most of the peripheral electrons of off-axis secondary electron beams 102_2se and 102_3se. In some embodiments, pre-limit aperture plate 155P may be configured to prevent secondary electrons from irradiating unintended apertures of secondary beam-limit aperture array 155.

In some embodiments, pre-limit aperture plate 155P may be positioned upstream from secondary beam-limit aperture array 155, as illustrated in FIG. 5. In the context of this disclosure, "upstream from" refers to the position of pre-limit aperture plate 155P such that one or more secondary electron beams 102_1se-102_3se may be incident on it before irradiating secondary beam-limit aperture array 155.

Pre-limit aperture plate 155P may be placed before secondary beam-limit aperture array 155 such that the aperture of pre-limit aperture plate 155P aligns with a desired aperture of secondary beam-limit aperture array 155. In such cases, the number of peripheral secondary electrons incident on secondary beam-limit aperture array 155 may be reduced or minimized. In some embodiments, pre-limit aperture plate 155P may be configured to block peripheral secondary electrons from being incident on other unintended apertures of secondary beam-limit aperture array 155, thus reducing crosstalk. Such a configuration may also enable the apertures of secondary beam-limit aperture array 155 to be positioned closer to each other, thereby allowing more apertures to be placed in a smaller area on aperture array 155, while mitigating the occurrence of crosstalk.

The size and shape of the apertures of secondary beam-limit aperture array 155 may vary over time based on the duration of usage, materials, inspection parameters, etc. For example, exposure to secondary electrons may cause contamination and debris formation on the edges of an aperture, thus reducing the effective size and shape of the aperture through which secondary electrons may pass. In some embodiments, placing pre-limit aperture plate 155P before secondary beam-limit aperture array 155 may reduce or minimize the variation in size and shape of apertures of secondary beam-limit aperture array 155 by reducing the number of incident peripheral secondary electrons.

In some embodiments, as illustrated in FIG. 4, apertures 155_1 and 155_2 of secondary beam-limit aperture array 155 may be separated from each other so that secondary electrons passing through pre-limit aperture plate 155P may only pass through one intended aperture of secondary beam-limit aperture array 155. In some embodiments, pre-limit aperture plate 155P may be configured to block peripheral electrons so that they do not pass through an aperture adjacent to an intended aperture of secondary beam-limit aperture array 155, enabling the apertures of secondary beam-limit aperture array 155 to be positioned closer to each other. This may allow designing aperture arrays comprising more aperture sizes in a smaller area on aperture array 155, while mitigating the occurrence of crosstalk.

In some embodiments, pre-limit aperture plate 155P may be positioned downstream from secondary beam-limit aperture array 155 (this embodiment is not illustrated), for example, between secondary beam-limit aperture array 155 and electron detection device 140. In the context of this disclosure, "downstream from" refers to the position of pre-limit aperture plate 155P such that one or more secondary electron beams 102_1se-102_3se may be incident on it after irradiating secondary beam-limit aperture array 155. Pre-limit aperture plate 155P may be positioned closer to secondary beam-limit aperture array 155 than electron detection device 140.

Although not illustrated in FIG. 5, in some embodiments, secondary imaging system 150 may comprise more than one pre-limit aperture plates 155P. For example, a primary pre-limit aperture plate 155P_1 (not illustrated) may be positioned upstream from secondary beam-limit aperture array 155 and a secondary pre-limit aperture plate 155P_2 (not illustrated) may be positioned downstream from secondary beam-limit aperture array 155. In such a configuration, primary pre-limit aperture plate 155P_1 may be configured to block majority of the peripheral secondary electrons from irradiating unintended apertures of secondary beam limit aperture array 155, and secondary pre-limit aperture plate 155P_2 may be configured to block any stray peripheral secondary electrons that may not have been blocked by primary pre-limit aperture plate 155, thus mitigating the occurrence of crosstalk. It is appreciated that other combinations of the number of pre-limit aperture plates and their arrangements are possible as well.

Pre-limit aperture plate 155P and secondary beam-limit aperture array 155 may be separated by an optimum distance 155G, as illustrated in FIG. 5. While it may be desirable to minimize distance 155G between pre-limit aperture plate 155P and secondary beam-limit aperture array 155 to reduce the possibility of peripheral secondary electrons escaping and illuminating other apertures of secondary beam-limit aperture array 155, distance 155G may be optimized to allow unrestricted movement of pre-limit aperture plate 155P and secondary beam-limit aperture array 155. In some embodiments, the distance between pre-limit aperture plate 155P and secondary beam-limit aperture array 155 may be 5 mm. In some embodiments, distance 155G may be determined based on mechanical design considerations, available space, manufacturability, and cost-efficiency, among other things. For example, it may be possible, using some techniques, to reliably and reproducibly achieve a distance of 3 mm to 5 mm between pre-limit aperture plate 155P and secondary beam-limit aperture array 155. In some embodiments, distance 155G may be more than 5 mm, for example, 10 mm, based on factors including, but not limited to, space availability, design limitations, cost-efficiency, materials, and intended application.

Reference is now made to FIGS. 6A-6D, which are schematic diagrams illustrating exemplary arrangement of apertures of secondary beam-limit aperture array 155 in secondary imaging system 150 of electron beam tool 500 shown in FIG. 5, consistent with embodiments of the present disclosure. It is appreciated that the sizes of apertures, size of secondary beam-limit aperture array 155, secondary electron beam size before pre-limit aperture plate 155P, and secondary electron beam size incident on secondary beam-limit aperture array 155 after passing through pre-limit aperture plate 155P are for illustrative purposes only and not drawn to scale.

As illustrated in FIGS. 6A-6D, cross-section 102se represents an outline of a beam of secondary electrons generated by primary beamlets (e.g., primary beamlets 102_1, 102_2, and 102_3 of FIG. 2) after interacting with the sample at probe spots 102_1S, 102_2S, and 102_3S, respectively.

Figure 6A:
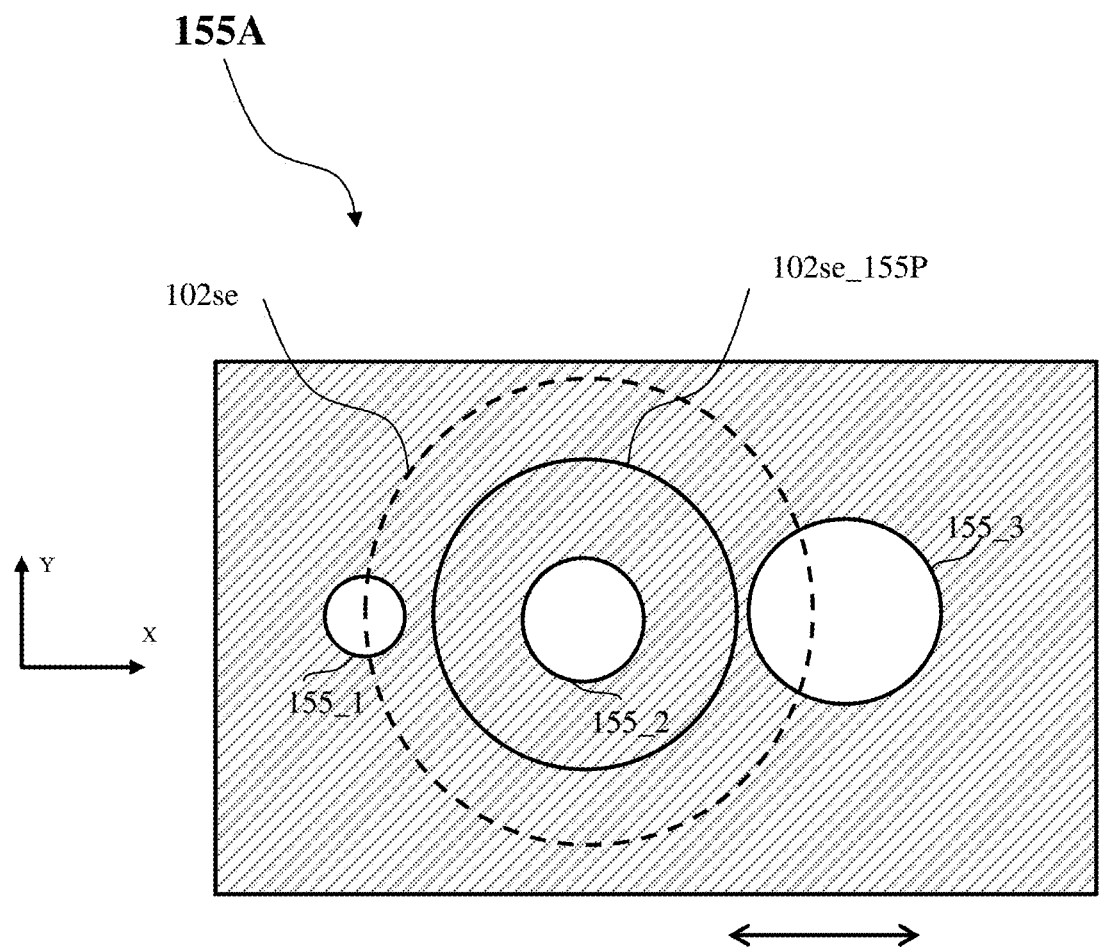
FIGS. 6A-6D are schematic diagrams illustrating exemplary arrangement of apertures of an aperture array of secondary imaging system of FIG. 5, consistent with embodiments of the present disclosure.

FIG. 6A illustrates a secondary beam-limit aperture array 155A comprising three apertures, 155_1, 155_2, and 155_3 placed in one direction such that the geometric centers of all apertures are aligned along an axis, for example, x axis. Although only three apertures are shown, any number of apertures may be used. In some embodiments, the number of apertures in such a configuration may be limited by the allowable size of secondary beam-limit aperture array 155A based on physical space available in secondary imaging system 150. One of the several advantages of using pre-limit aperture plate 155P is that it allows reduction in separation distance between two adjacent apertures by blocking off all the peripheral secondary electrons from illuminating apertures of secondary beam-limit aperture array 155A not in use for detection. In addition, using pre-limit aperture plate 155P may allow reduction in crosstalk.

The reduced separation distance between two adjacent apertures is shown in FIG. 6A. In this context, the separation distance between two apertures may be referred to as the linear distance between the geometric centers of the two adjacent apertures. In some embodiments, the separation distance between two apertures across the array may be uniform. For example, separation distance between apertures 155_1 and 155_2 may be similar to the separation distance between apertures 155_2 and 155_3. In some embodiments, the separation distance may be non-uniform.

In some embodiments, secondary beam-limit aperture array 155A may be configured to move along a single axis such as the x axis, to adjust the size of the aperture through which overlapping secondary electron beam may pass.

As shown in FIG. 6A, secondary beam-limit aperture array 155A may comprise apertures of different sizes. In some embodiments, apertures 155_1, 155_2, and 155_3 of secondary beam-limit aperture array 155A may be uniform in size, shape, cross-section, and pitch. In some embodiments, the radius of aperture of pre-limit aperture plate 155P may be slightly larger than the radius of the largest aperture of secondary beam-limit aperture array 155. Pre-limit aperture plate 155P and secondary beam-limit aperture array 155 may be aligned such that the geometric centers of the aperture of pre-limit aperture plate 155P and secondary beam-limit aperture array 155 are aligned with secondary optical axis 150_1.

Figure 6B:
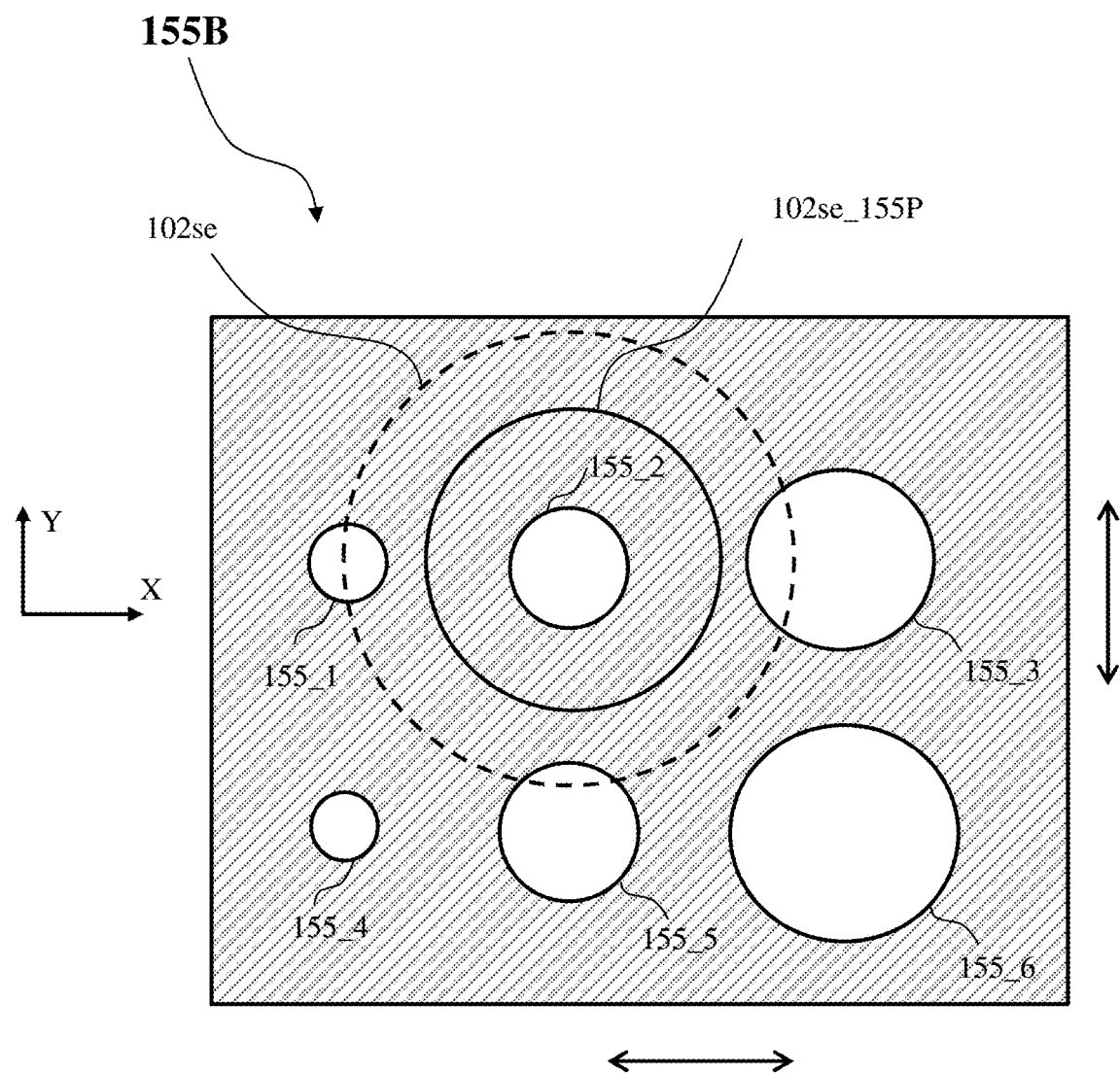

FIG. 6B illustrates a secondary beam-limit aperture array 155B comprising six apertures, 155_1-155_6 placed in a rectangular matrix along x and y axes. In some embodiments, secondary beam-limit aperture array 155B may comprise apertures of different sizes. In some embodiments, secondary beam-limit aperture array 155B may comprise at least two apertures of similar size. Cross-section 102se_155P represents an outline of the beam of secondary electrons (represented by cross-section 102se) generated by primary beamlets 102_1, 102_2, and 102_3 and passing through pre-limit aperture plate 155P. It is appreciated that cross-sections 102se and 102se_155P represent outlines of secondary electron beams at different planes along secondary optical axis 150_1.

In some embodiments, secondary beam-limit aperture array 155B may be configured to move along both, the x and y axes, to adjust the size of the aperture through which overlapping secondary electron beam may pass. Although FIGS. 6A and 6B illustrate rectangular secondary beam-limit aperture arrays (e.g., 155A and 155B), other shapes including, but not limited to, circular, triangular, elliptical, etc. may be used. It is appreciated that the size and the shape of secondary beam-limit aperture arrays may be determined based on physical space available, mechanical design considerations, cost-efficiency, etc.

Figure 6C:
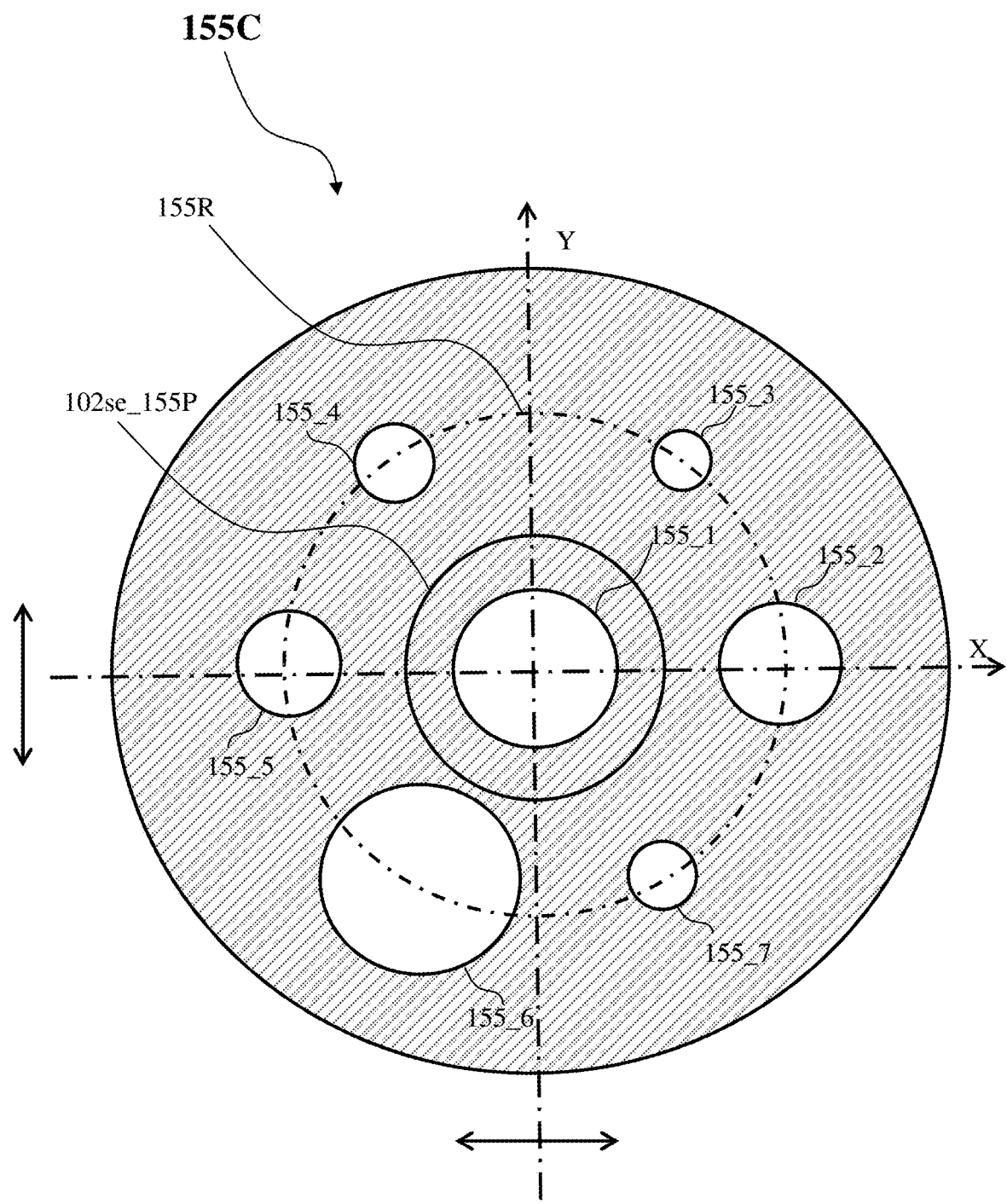

Reference is now made to FIG. 6C, which illustrates a circular secondary beam-limit aperture array 155C comprising seven apertures, 155_1-155_7. In some embodiments, secondary beam-limit aperture array 155C may comprise a center aperture 155_1 and six off-center apertures 155-155_7 arranged radially around center aperture 155_1. As illustrated in FIG. 6C, off-center apertures may be positioned along a virtual circle 155R so that the separation distance between the center of center aperture 155_1 and the center of each of the off-center apertures 155_2-155_7 may be uniform. In other words, the separation distance between the center of center aperture 155_1 and the center of each of the off-center apertures 155_2-155_7 may be similar or substantially similar to the radius of 155R. In such embodiments, the separation distance, or radius of virtual circle 155R may be determined based on the radius of cross-section 102se_155P and the radius of the largest aperture (e.g., aperture 155_6 of FIG. 6C) of secondary beam-limit aperture array 155C. In some embodiments, the separation distance, may be larger than the sum of the radius of cross-section 102se_155P and the radius of the largest aperture 155_6, for example, of secondary beam-limit aperture array 155C.

As illustrated in FIG. 6C, secondary beam-limit aperture array 155C may comprise apertures of different sizes. The center aperture 155_1 may be different in size compared to off-center apertures 155-155_7. In some embodiments, each of the off-center apertures may be of different sizes, randomly arranged in size along the perimeter of virtual circle 155R.

In some embodiments, secondary beam-limit aperture array 155C may be configured to move along both, x and y-axes, to adjust the size of the aperture through which overlapping secondary electron beam may pass. One of the several advantages of a circular arrangement of apertures in secondary beam-limit aperture array 155C is that a variety of aperture sizes may be accessed with limited movement in x and y axes.

Figure 6D:
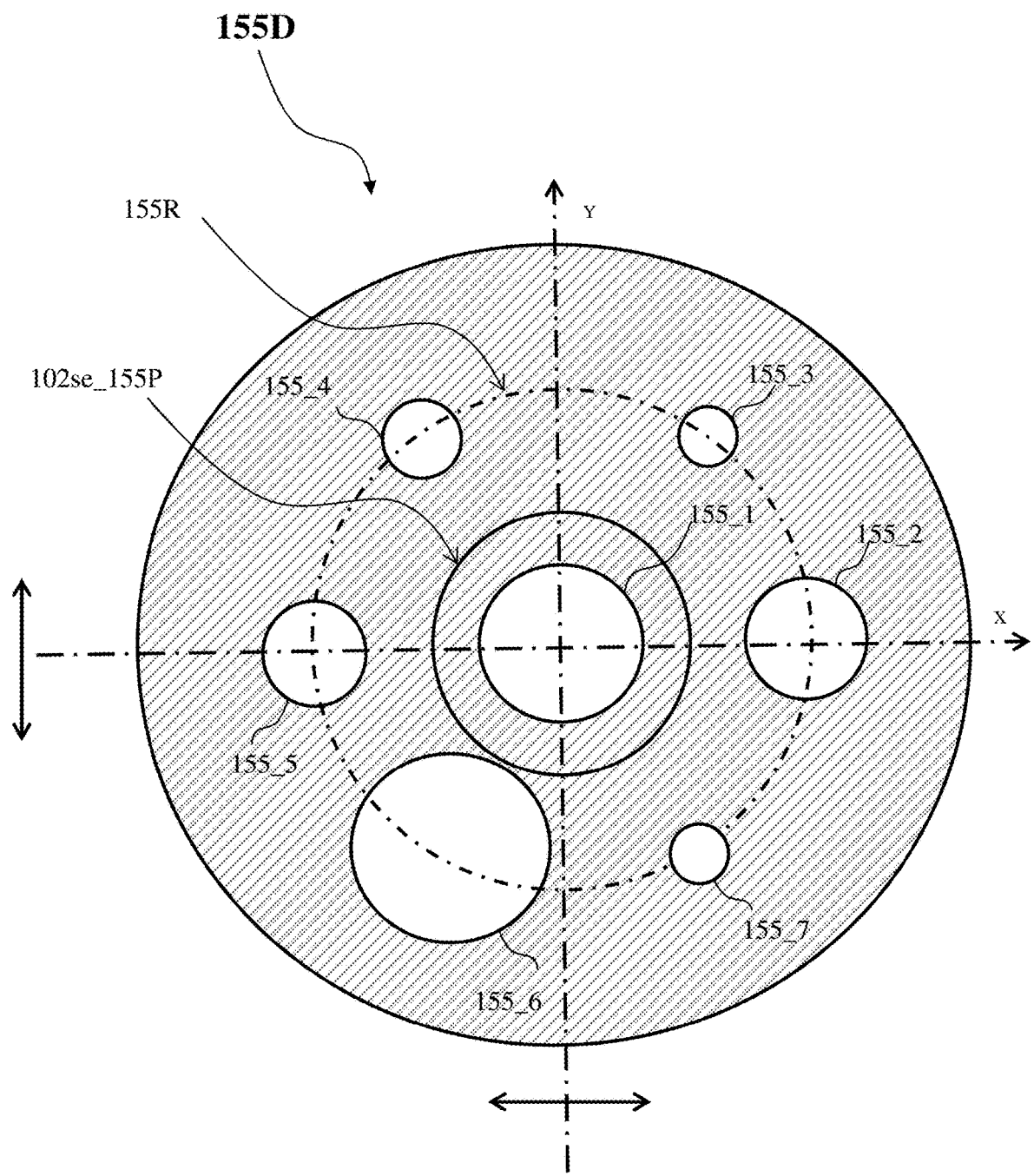

FIG. 6D illustrates a circular secondary beam-limit aperture array 155D comprising seven apertures, 155_1-155_7. In comparison to FIG. 6C, two or more apertures of secondary beam-limit aperture array 155D may be similar or substantially similar in size. For example, off-center apertures 155_3 and 155_7 are similar in size. Although FIG. 6D illustrates two off-center apertures 155_3 and 155_7 having similar sizes, it is appreciated that any two or more apertures may have similar sizes.

In some embodiments, apertures may be contaminated after long periods of use, for example due to particles, debris, and gas generated by secondary electrons incident on secondary beam-limit aperture array 155D. The contamination may change the effective size or shape of the aperture, affecting the collection efficiency of detection elements (e.g., 140_1, 140_2, and 140_3 of FIG. 3) of electron detection device 140, and therefore impacting the overall throughput and resolution of images. The problem of contamination may be exaggerated in smaller apertures such as 155_3, partly because small apertures block a large portion of the secondary electrons incident on the array compared to larger apertures. In addition, smaller apertures have smaller circumferences, and therefore, for the same duration of exposure to secondary electrons, the percentage reduction in effective size of the aperture may be larger compared to larger apertures. One of the several advantages of having two or more apertures of similar sizes may be reduction in tool down-time due to maintenance. For example, if one of the apertures is contaminated, a second aperture of similar size may be used, allowing uninterrupted tool usage and resultantly improving overall throughput of wafer inspection.

Figure 7:
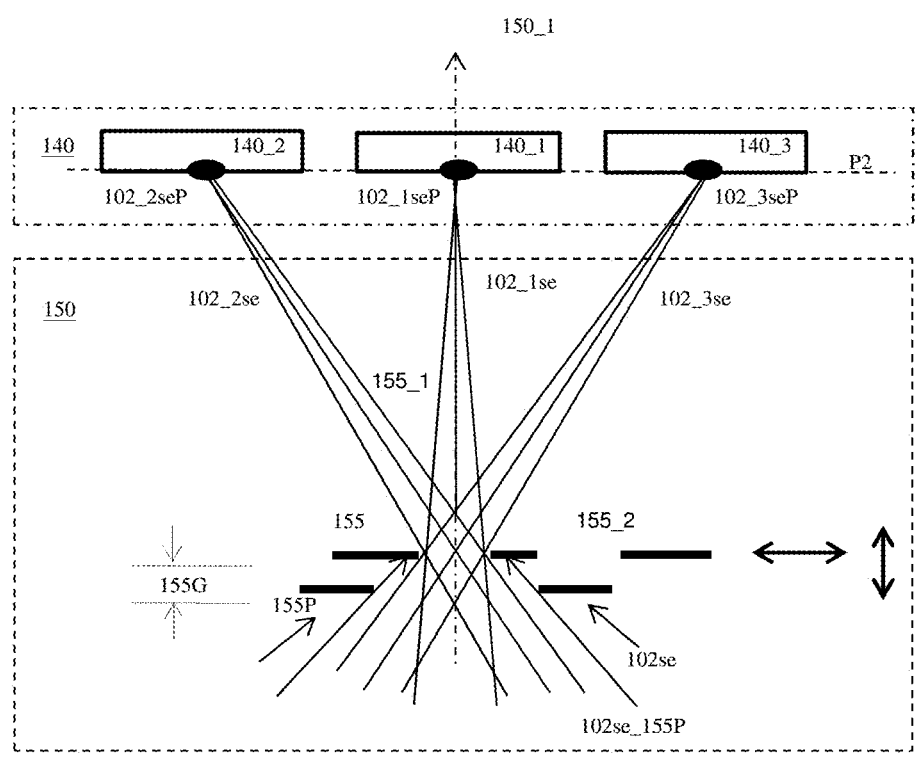
FIG. 7 is a schematic diagram illustrating an exemplary configuration of a secondary imaging system in a multi-beam apparatus, consistent with embodiments of the present disclosure.

Reference is now made to FIG. 7, which illustrates an exemplary configuration 700 of a secondary imaging system 150 in a multi-beam apparatus, consistent with embodiments of the present disclosure. It is appreciated that secondary imaging system 150 may be part of charged-particle beam inspection system (e.g., electron beam inspection system 100 of FIG. 1).

As illustrated in FIG. 7, secondary imaging system 150 may comprise a movable secondary beam-limit aperture array 155 configured to move in three directions along the x, y, and z axes. In some embodiments, secondary beam-limit aperture array 155 may be moved along x and y axes to select a desired aperture size, and along z axis to match the position of secondary beam crossover plane, while pre-limit aperture plate 155P is fixed in its position. The x and y axes may be perpendicular to secondary optical axis 150_1 and the z axis may be parallel to secondary optical axis 150_1.

In some embodiments, the position of secondary beam crossover plane along secondary optical axis 150_1 may be determined based at least on factors including, but not limited to, landing energies of primary beamlets, and excitation of objective lens 131. In some embodiments, the corresponding positions of secondary beam crossover plane for a range of landing energies of primary beamlets may be determined based on simulations and data modeling algorithms.

Based on the landing energies of the primary beamlets, the secondary electron beams may overlap at different planes perpendicular to secondary optical axis 150_1, thus forming a range of secondary beam crossover plane positions for a corresponding range of landing energies. In some embodiments, the crossover plane positions may be determined based on a simulation of landing energies, and therefore, the range of secondary beam crossover plane positions may be determined based on the range of landing energies used in the system. For example, a user or the system may theoretically determine, based on simulation such as an algorithm, the coordinates of the secondary beam crossover plane for a given value of landing energies of the primary beamlets.

In some embodiments, if the position of secondary beam-limit aperture array 155 is adjusted along the z axis to align with the position of the secondary beam crossover plane, then the position of pre-limit aperture plate 155P may fall out of the range of secondary beam crossover plane positions. This may increase the size of secondary electron beams (e.g., represented as 102se_155P in FIGS. 6A-6D) incident on secondary beam-limit aperture array 155. Although a large beam size incident on secondary beam-limit aperture array 155 may enhance the number of secondary electrons incident on detector elements of electron detection device, it may increase the possibility of occurrence of crosstalk as well.

Figure 8:
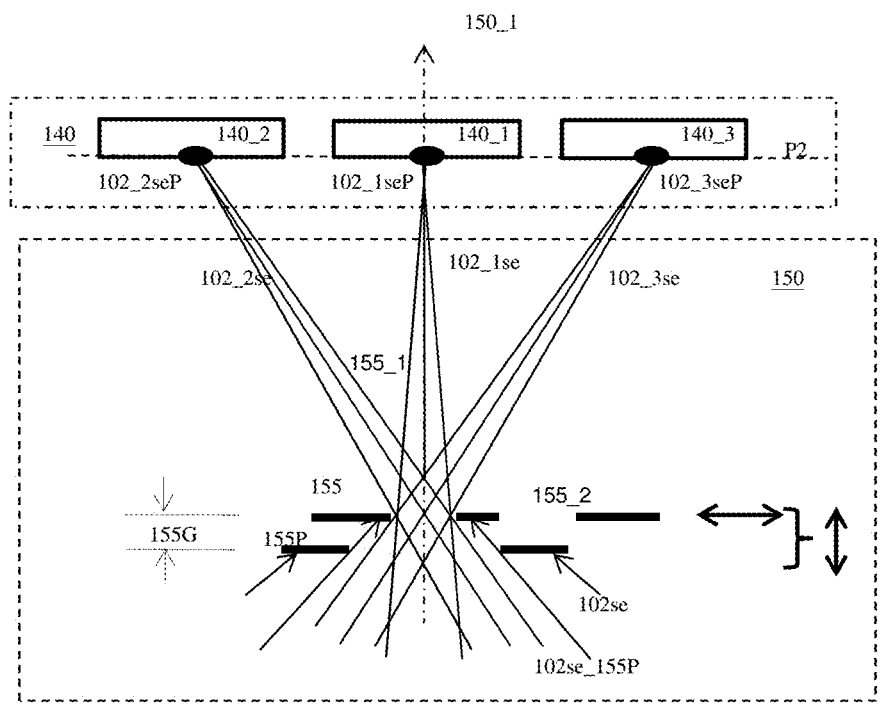
FIG. 8 is a schematic diagram illustrating an exemplary configuration of a secondary imaging system in a multi-beam apparatus, consistent with embodiments of the present disclosure.

Reference is now made to FIG. 8, which illustrates an exemplary configuration 800 of a secondary imaging system 150 in a multi-beam apparatus, consistent with embodiments of the present disclosure. It is appreciated that secondary imaging system 150 may be part of charged-particle beam inspection system (e.g., electron beam inspection system 100 of FIG. 1).

As illustrated in FIG. 8, secondary imaging system 150 may comprise a movable pre-limit aperture plate 155P and a movable secondary beam-limit aperture array 155. Movable pre-limit aperture plate 155P may be configured to independently move in three directions along the x, y and z axes. In some embodiments, movable pre-limit aperture plate 155P may be configured to move along with movable secondary beam-limit aperture array 155 such that the distance 155G is maintained.

In some embodiments, movable pre-limit aperture plate 155P and secondary beam-limit aperture array 155 may be moved together such that the position of secondary beam-limit aperture array 155 aligns with the position of the secondary beam crossover plane. In such a scenario, based on distance 155G and the range of crossover positions, pre-limit aperture plate 155P and secondary beam-limit aperture array 155 may both be placed within the range of crossover positions. In some embodiments, it may be desirable to have pre-limit aperture plate 155P and secondary beam-limit aperture array 155 within the range of crossover positions along secondary optical axis 150_1 to effectively block peripheral electrons and reduce the possibility of crosstalk.

Figure 9:
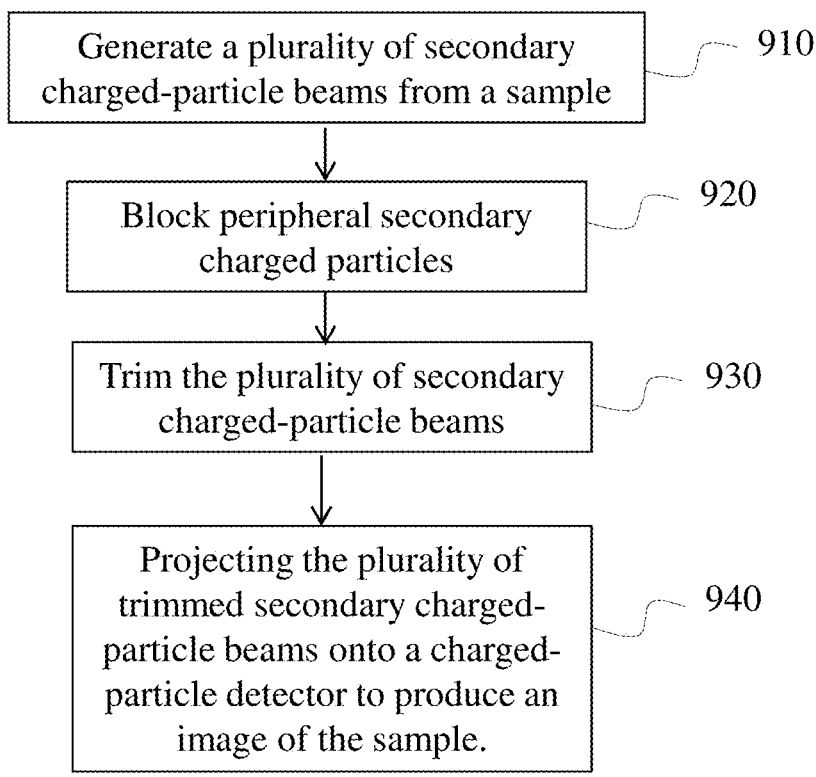
FIG. 9 is a process flowchart representing an exemplary method of detecting secondary charged particles from a sample using a secondary imaging system of FIG. 5, consistent with embodiments of the present disclosure.

Reference is now made to FIG. 9, which illustrates a process flowchart representing an exemplary method 900 performed by a secondary imaging system (e.g., secondary imaging system 150 of FIG. 3) to form images of a sample, consistent with embodiments of the present disclosure. Method 900 may be performed by controller 50 of EBI system 100, as shown in FIG. 1, for example Controller 50 may be programmed to implement one or more steps of method 900. For example, controller 50 may instruct a module of a charged particle beam apparatus to activate a charged-particle source to generate charged particle beams, which upon interaction with the sample may generate secondary charged-particle beams.

In step 910, multiple secondary electron beams (e.g., 102_1se, 102_2se, 102_3se of FIG. 3) may be generated from the sample (e.g., sample 1 of FIG. 2) upon interaction of primary beamlets (e.g., 102_1, 102_2, and 102_3 of FIG. 2) with probe spots (e.g., 102_1S, 102_2S, and 102_3S of FIG. 2) of the sample. In some embodiments, the number of secondary electron beams generated may be equal to the number of primary beamlets incident on the sample. The three secondary electron beams 102_1se, 102_2se and 102_3se may be diverted by a beam separator such as a Wien Filter (e.g., beam separator 160 of FIG. 2) to enter secondary imaging system 150 along secondary optical axis 150_1 thereof.

Step 910 may further include directing secondary electron beams 102_1se-102_3se such that they overlap at a common area of crossing along the secondary optical axis and therefore form a secondary beam crossover (e.g., such as a relatively sharp secondary beam crossover). The plane where the common area of crossing or secondary beam crossover is located is referred to as a crossing plane or secondary beam crossover plane. A beam-limiting aperture array (e.g., secondary beam-limit aperture array 155 of FIG. 3) may be positioned at or near the secondary beam crossover plane. In some embodiments, a pre-limit aperture plate (e.g., pre-limit aperture plate 155P of FIG. 3) may be placed before the secondary beam-limit aperture array.

In step 920, peripheral secondary electrons of secondary electron beams may be blocked using the pre-limit aperture plate before illuminating the secondary beam-limit aperture array. Pre-limit aperture plate may comprise a plate with an aperture configured to block peripheral electrons while allowing axial electrons of secondary electron beams. In some embodiments, pre-limit aperture plate may be aligned with secondary beam-limit aperture array and secondary optical axis such that it blocks most of the peripheral electrons of off-axis secondary electron beams.

In some embodiments, pre-limit aperture plate and secondary beam-limit aperture array may be separated by an optimum distance (e.g., distance 155G as illustrated in FIG. 5). While it may be desirable to minimize the distance between pre-limit aperture plate and secondary beam-limit aperture array to reduce the possibility of peripheral secondary electrons escaping and irradiating other unintended apertures of secondary beam-limit aperture array, it may be optimized to allow unrestricted movement of pre-limit aperture plate and secondary beam-limit aperture array. In some embodiments, the distance between pre-limit aperture plate and secondary beam-limit aperture array may be 5 mm. In some embodiments, distance may be determined based on mechanical design considerations, available space, manufacturability, and cost-efficiency, among other things. For example, it may be possible, using some techniques, to reliably and reproducibly achieve a distance of 3 mm to 5 mm between pre-limit aperture plate 155P and secondary beam-limit aperture array 155. In some embodiments, the distance may be more than 5 mm, for example, 10 mm, based on factors including, but not limited to, space availability, design limitations, cost-efficiency, materials, and intended application.

In step 930, the secondary electron beams may be further trimmed using the beam-limit aperture array. The secondary beam-limit aperture array may be placed at or within a moving range of positions of the secondary beam crossover plane. The secondary beam-limit aperture array may be moved along secondary beam crossover plane such that the desired aperture or aperture size may be used to block off peripheral secondary electrons directed towards charged-particle detection elements (e.g., electron detection device 140 of FIG. 3). The position of secondary beam crossover plane may depend on landing energy of primary beamlets or excitations of objective lens (e.g., objective lens 131 of FIG. 2), among other things. Secondary beam-limit aperture array may be placed at an optimal position within a secondary beam crossover plane moving range.

In some embodiments, the order of steps 920 and 930 may be interchangeable. For example, the pre-limit aperture plate may be placed upstream from or downstream from the secondary beam limit aperture array such that the secondary electron beams 102_1se-102_3se may be incident on it before or after irradiating the secondary beam-limit aperture array, respectively. In some embodiments, a pre-limit aperture plate (e.g., primary pre-limit aperture plate 155P_1 (not illustrated)) may be placed upstream from secondary beam-limit aperture array and another pre-limit aperture plate (e.g., pre-limit aperture plate 155P_2 (not illustrated)) may be placed downstream from secondary beam-limit aperture array 155. In such a configuration, one pre-limit aperture plate (e.g., 155P_1) may be configured to block majority of the peripheral secondary electrons from irradiating unintended apertures of secondary beam limit aperture array 155, and another pre-limit aperture plate (e.g., 155P_2) may be configured to block any stray peripheral secondary electrons that may not have been blocked by the first pre-limit aperture plate, thus mitigating the possibility of occurrence of crosstalk. It is appreciated that other combinations of the number of pre-limit aperture plates and their arrangements may be used, as desired.

In step 940, the trimmed secondary electron beams may be projected towards the detection elements (e.g., 140_1, 140_2, and 140_3 of FIG. 3) of the electron detection device to produce images of the probed regions of the sample.

The embodiments may further be described using the following clauses:

1. An electro-optical system comprising:
   a first pre-limit aperture plate comprising a first aperture configured to block peripheral charged-particles of a plurality of secondary charged-particle beams from a sample; and
   a beam-limit aperture array comprising a second aperture configured to trim the plurality of secondary charged-particle beams.

2. The system of clause 1, further comprising a charged-particle detector including a plurality of detection elements, wherein a detection element of the plurality of detection elements is associated with a corresponding trimmed beam of the plurality of secondary charged-particle beams.

3. The system of any one of clauses 1 and 2, wherein a distance between the first pre-limit aperture plate and the beam-limit aperture array is 5 mm or less.

4. The system of any one of clauses 1-3, wherein the first pre-limit aperture plate is positioned upstream from the beam-limit aperture array.

5. The system of any one of clauses 2-4, wherein the first pre-limit aperture plate is positioned downstream from the beam limit aperture array.

6. The system of any one of clauses 1 and 2, further comprising a second pre-limit aperture plate.

7. The system of clause 6, wherein the first pre-limit aperture plate is positioned upstream from the beam-limit aperture array and the second pre-limit aperture plate is positioned downstream from the beam-limit aperture array.

8. The system of any one of clauses 1-7, wherein the plurality of secondary charged-particle beams comprises at least one of secondary electrons or back-scattered electrons generated from the sample in response to an interaction between a plurality of primary charged-particle beams and the sample.

9. The system of any one of clauses 1-8, wherein the beam-limit aperture array comprises a plurality of apertures of different sizes.

10. The system of clause 9, wherein at least two of the plurality of apertures have similar sizes.

11. The system of any one of clauses 9-10, wherein the plurality of apertures is arranged in a rectangular, a circular, or a spiral pattern.

12. The system of any one of clauses 1-11, wherein the plurality of secondary charged-particle beams overlap to create a crossover area on a crossover plane perpendicular to a secondary optical axis of the electro-optical system.

13. The system of clause 12, wherein the beam-limit aperture array is placed on or within a range of positions of the crossover plane and perpendicular to the secondary optical axis.

14. The system of any one of clauses 12 and 13, wherein the range of positions of the crossover plane is determined based on a landing energy of the plurality of primary charged-particle beams on the sample.

15. The system of any one of clauses 12-14, wherein the second aperture is centered with the crossover area.

16. The system of any one of clauses 12-15, wherein centers of the first and the second apertures are aligned with the secondary optical axis.

17. The system of any one of clauses 12-16, wherein the beam-limit aperture array is movable to align an aperture of the plurality of apertures with the crossover area.

18. The system of any one of clauses 14-17, wherein the beam-limit aperture array is movable along the secondary optical axis based on the range of positions of the crossover plane.

19. The system of any one of clauses 12-18, wherein a plane of the first pre-limit aperture plate is outside the range of positions of the crossover plane.

20. The system of clause 19, wherein planes of the beam-limit aperture array and the first pre-limit aperture plate are within the range of positions of the crossover plane.

21. A multi charged-particle beam apparatus comprising:
   an electro-optical system for projecting a plurality of secondary charged-particle beams from a sample onto a charged-particle detector, the electro-optical system comprising:
      a first pre-limit aperture plate comprising a first aperture configured to block peripheral charged-particles of the plurality of secondary charged-particle beams; and
      a beam-limit aperture array comprising a second aperture configured to trim the plurality of secondary charged-particle beams,
   wherein the charged-particle detector includes a plurality of detection elements, and
   wherein a detection element of the plurality of detection elements is associated with a corresponding trimmed beam of the plurality of secondary charged-particle beams.

22. The apparatus of clause 21, wherein a distance between the first pre-limit aperture plate and the beam-limit aperture array is 5 mm or less.

23. The apparatus of any one of clauses 21 and 22, wherein the first pre-limit aperture plate is positioned upstream from the beam-limit aperture array.

24. The apparatus of any one of clauses 21-23, wherein the first pre-limit aperture plate is positioned downstream from the beam-limit aperture array.

25. The apparatus of clause 21, further comprising a second pre-limit aperture plate.

26. The apparatus of clause 25, wherein the first pre-limit aperture plate is positioned upstream from the beam-limit aperture array and the second pre-limit aperture plate is positioned downstream from the beam-limit aperture array.

27. The apparatus of any one of clauses 21-26, wherein the plurality of secondary charged-particle beams comprises at least one of secondary electrons or back-scattered electrons generated from the sample in response to an interaction between a plurality of primary charged-particle beams and the sample.

28. The apparatus of any one of clauses 21-27, wherein the beam-limit aperture array comprises a plurality of apertures of different sizes.

29. The apparatus of clause 28, wherein at least two of the plurality of apertures have similar sizes.

30. The apparatus of any one of clauses 28 and 29, wherein the plurality of apertures is arranged in a rectangular, a circular, or a spiral pattern.

31. The apparatus of any one of clauses 21-30, wherein the plurality of secondary charged-particle beams overlap to create a crossover area on a crossover plane perpendicular to a secondary optical axis of the electro-optical system.

32. The apparatus of clause 31, wherein the beam-limit aperture array is placed on or within a range of positions of the crossover plane and perpendicular to the secondary optical axis.

33. The apparatus of any one of clauses 31 and 32, wherein the range of positions of the crossover plane is determined based on a landing energy of the plurality of primary charged-particle beams on the sample.

34. The apparatus of any one of clauses 31-33, wherein the second aperture is centered with the crossover area.

35. The apparatus of any one of clauses 31-34, wherein centers of the first and the second apertures are aligned with the secondary optical axis.

36. The apparatus of any one of clauses 31-35, wherein the beam-limit aperture array is movable to align an aperture of the plurality of apertures with the crossover area.

37. The apparatus of any one of clauses 33-36, wherein the beam-limit aperture array is movable along the secondary optical axis based on the range of positions of the crossover plane.

38. The apparatus of any one of clauses 31-37, wherein a plane of the first pre-limit aperture plate is outside the range of positions of the crossover plane.

39. The apparatus of clause 38, wherein planes of the beam-limit aperture array and the first pre-limit aperture plate are within the range of positions of the crossover plane.

40. A method performed by a secondary imaging system to form images of a sample, the method comprising:
generating a plurality of secondary charged-particle beams from the sample;
blocking, using a pre-limit aperture plate, peripheral charged-particles of the plurality of secondary charged-particle beams;
trimming, using an aperture of a beam-limit aperture array, the plurality of secondary charged-particle beams; and
projecting the plurality of trimmed secondary charged-particle beams onto a corresponding detection element of a charged-particle detector.

A non-transitory computer readable medium may be provided that stores instructions for a processor of a controller (e.g., controller 50 of FIG. 1) to carry out image inspection, image acquisition, condenser lens adjusting, activating charged-particle source, beam deflecting, positioning of beam-limit aperture array (e.g., secondary beam-limit aperture array 155), positioning pre-limit aperture plate (e.g., pre-limit aperture plate 155P), etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. An electro-optical system comprising:
a first pre-limit aperture plate comprising a first aperture configured to block peripheral charged-particles of a plurality of secondary charged-particle beams traveling in respective paths associated with a secondary optical axis; and
a beam-limit aperture array movable along the secondary optical axis and comprising a plurality of apertures, wherein a second aperture of the plurality of apertures is configured to further trim the plurality of secondary charged-particle beams.

2. The system of claim 1, further comprising a charged-particle detector including a plurality of detection elements, wherein a detection element of the plurality of detection elements is associated with a corresponding trimmed beam of the plurality of secondary charged-particle beams.

3. The system of claim 1, wherein a distance between the first pre-limit aperture plate and the beam-limit aperture array is 5 mm or less.

4. The system of claim 1, wherein the first pre-limit aperture plate is positioned upstream from the beam-limit aperture array.

5. The system of claim 2, wherein the first pre-limit aperture plate is positioned downstream from the beam-limit aperture array.

6. The system of claim 1, further comprising a second pre-limit aperture plate.

7. The system of claim 6, wherein the first pre-limit aperture plate is positioned upstream from the beam-limit aperture array and the second pre-limit aperture plate is positioned downstream from the beam-limit aperture array.

8. The system of claim 1, wherein the plurality of secondary charged-particle beams comprises at least one of secondary electrons or back-scattered electrons generated from a sample in response to an interaction between a plurality of primary charged-particle beams and the sample.

9. The system of claim 1, wherein the plurality of apertures of the beam-limit aperture array comprises apertures of different sizes.

10. The system of claim 9, wherein at least two of the plurality of apertures have similar sizes.

11. The system of claim 9, wherein the plurality of apertures is arranged in a rectangular, a circular, or a spiral pattern.

12. The system of claim 1, wherein the plurality of secondary charged-particle beams overlap to create a crossover area on a crossover plane perpendicular to the secondary optical axis of the electro-optical system.

13. The system of claim 12, wherein the beam-limit aperture array is placed on or within a range of positions of the crossover plane and perpendicular to the secondary optical axis.

14. The system of claim 13, wherein the range of positions of the crossover plane is determined based on a landing energy of a plurality of primary charged-particle beams.

15. A method performed by a secondary imaging system to form images of a sample, the method comprising: generating a plurality of secondary charged-particle beams from the sample; blocking, using a pre-limit aperture plate, peripheral charged-particles of the plurality of secondary charged-particle beams; trimming, using an aperture of a beam-limit aperture array comprising a plurality of apertures and movable along a secondary optical axis of the secondary imaging system, the plurality of secondary charged-particle beams; and projecting the plurality of trimmed secondary charged-particle beams onto a corresponding detection element of a charged-particle detector.

16. The system of claim 3, wherein the distance between the first pre-limit aperture plate and the beam-limit aperture array along the secondary optical axis is adjusted such that the first pre-limit aperture plate blocks the peripheral charged-particles from passing through apertures adjacent to the second aperture.

17. The system of claim 1, wherein a size of the second aperture is smaller than the first aperture.

18. The system of claim 1, wherein the first aperture and the second aperture are aligned with the secondary optical axis.

* * * * *